United States Patent [19]

Crouse

[11] Patent Number: 5,066,856
[45] Date of Patent: Nov. 19, 1991

[54] OPTICAL MICRO-SWITCH APPARATUS

[75] Inventor: Ronald J. Crouse, Dallas, Tex.

[73] Assignee: Optoswitch, Inc., McKinney, Tex.

[21] Appl. No.: 498,811

[22] Filed: Mar. 23, 1990

[51] Int. Cl.[5] .............................................. G01D 5/34
[52] U.S. Cl. .................................... 250/229; 250/239
[58] Field of Search ................... 250/229, 231.19, 221, 250/239; 341/31; 200/61.02

[56] References Cited

U.S. PATENT DOCUMENTS

| | | | |
|---|---|---|---|
| 3,336,482 | 8/1967 | Mierendorf et al. | 250/229 |
| 3,465,099 | 9/1969 | Harris | 341/31 |
| 3,628,037 | 12/1971 | Yamamoto et al. | 250/229 |
| 3,668,407 | 6/1972 | Matzen et al. | 250/229 |
| 3,768,158 | 10/1973 | Little et al. | 29/622 |
| 3,898,454 | 8/1975 | Friday et al. | 250/229 |
| 3,949,219 | 4/1976 | Crouse | 250/229 |
| 4,172,218 | 10/1979 | Sugisaka | 200/273 |
| 4,196,348 | 4/1980 | Iwakiri et al. | 250/229 |
| 4,278,965 | 7/1981 | Nelson et al. | 250/229 |
| 4,442,425 | 4/1984 | Eibner | 250/229 |
| 4,690,484 | 9/1987 | Oba et al. | 439/736 |
| 4,764,645 | 8/1988 | Takasawa | 200/16 F |
| 4,816,671 | 3/1989 | Umemura | 250/229 |

*Primary Examiner*—Davis L. Willis
*Assistant Examiner*—Michael Messinger

*Attorney, Agent, or Firm*—Richards, Medlock & Andrews

[57] ABSTRACT

This invention provides an optical micro-switch, and a method of mass-producing such optical micro-switches. The optical micro-switch comprises a first housing half containing electronic circuitry which generates light and a second housing half containing electronic circuitry which senses light, the electronic circuitry is separated by a plunger with an aperture and a slide with two apertures. The plunger and slide are positioned in the light transmission path between the light-emitting circuitry and the light sensing circuitry. The optical micro-switch has an input prong, output prong, and a ground prong. The slide can be moved into either of two different positions which configures the switch as a normally open switch or a normally closed switch. In mass-producing these optical micro-switches, a continuous tape lead frame is provided. This continuous tape lead frame contains duplicate sets of frame portions for the first housing half and a second housing half of each optical micro-switch produced. The housing halves are molded around their respective frame portions, and the components of the optical micro-switch are assembled into the housing halves. The lead frame is folded to engage the housing halves and seal the components therein, completing the manufacture of the optical micro-switch.

20 Claims, 3 Drawing Sheets

OPTICAL MICRO-SWITCH APPARATUS

TECHNICAL FIELD OF THE INVENTION

This invention relates in general to optical micro-switches, and in particular to an optical micro-switch which can be easily adjusted for normally open or normally closed operation, and to a method of mass-producing such optical micro-switches.

BACKGROUND OF THE INVENTION

Many of the micro-switches now used in electrical and electromechanical applications are mechanical type switches. Mechanical switches, however, are prone to several problems. For example, current flow through the contacts can lead to electrical erosion, and the continued opening and closing of the contacts can lead to wear or damage. Furthermore, contact bounce frequently occurs whenever contact switches are used.

To reduce these problems, optical switches have been developed which require minimal mechanical action. In optical switches, instead of one contact mechanically meeting another contact, a light source impinges on a light-sensing device to provide current flow through the switch.

An example of an optical switch is disclosed in U.S. Pat. No. 3,949,219 issued to Crouse. An optical path interconnecting two cavities is opened or blocked by the movement of a opaque plunger having a plurality of apertures. The switch may be converted from a normally open to a normally closed switch, or vice versa, by rotation of the plunger to alternately select the aperture in the plunger which may be placed in register with the optical path. Rotation of the plunger to convert the switch requires several steps. First, the plunger must be pushed into the top portion of the housing until a shaft portion passes through a bottom opening. Then, the plunger must be rotated by 90°. Then, the plunger must be reinserted into the housing into its original position. This switch requires the use of two input leads and two output leads.

It is an object of the present invention to provide an optical switch which can be easily converted from a normally open to a normally closed switch, or vice versa. Another object of this invention is to provide a three terminal optical switch. Still another object is to provide an effective method of mass-producing such optical switches.

SUMMARY OF THE INVENTION

In accordance with the present invention, an optical micro-switch is provided which can be easily converted from a normally open to a normally closed configuration. A method of mass-producing such optical micro-switches is also disclosed.

The housing of the optical micro-switch has a first housing half and a second housing half. The first housing half contains electronic circuitry which generates light, while the second housing half contains electronic circuitry which senses light. The second housing half also contains a slide which has two apertures and which is placed on top of the electronic circuitry which senses light. Both housing halves together receive a plunger which has an aperture, the plunger being placed on top of a spring which urges the plunger upwardly so that it extends through the top of the housing. A lever attached to the top of the housing can be lowered to make contact with the plunger and to urge the plunger back into the housing. The first housing half and the second housing half are formed around a lead frame. Portions of this lead frame comprise the electrical interconnections for the electronic circuitry which generates light and the electronic circuitry which senses light. The lead frame includes an input prong, an output prong, and a ground prong which extend through the bottom of the housing.

When a sufficient voltage is applied to the input prong, the electronic circuitry will generate light. If this light travels to the electronic circuitry which senses light, a voltage output results on the output prong. If the electronic circuitry does not sense light, the output prong is tied to the ground prong. Light travel from the first housing half to the second housing half depends on whether a light passageway is provided. Such a light passageway is provided when the plunger aperture aligns with one of the slide apertures. In the embodiment discussed, when the slide is in the normally open position and the lever is in the non-actuated position, the plunger aperture does not align with the slide aperture. If the lever is actuated, light passes to the second housing half. When the slide is in the normally closed position, if the lever is in the non-actuated position then light passes from the first housing to the second housing half. If the lever is actuated, light is blocked from passing to the second housing half.

When mass-producing such optical micro-switches, a continuous tape lead frame is first provided. This continuous tape lead frame contains duplicative sets of a first housing half frame portion and a second housing half frame portion. To each first housing half frame portion, a first housing half plastic module is molded, and to each second hosing half frame portion, a second housing half plastic module is molded. The various components of the optical micro-switch are assembled into each duplicative set of housing halves. Once all of the components are assembled, each duplicative set of housing halves is sheared or cut from the adjacent housing halves. The final process step performed on each duplicative set of housing halves involves folding the lead frame so as to engage the first housing half with the second housing half and the seal the components therein.

BRIEF DESCRIPTION OF THE DRAWINGS

Further features and advantages will become apparent from the following and more particular description of the preferred embodiment of the invention, as illustrated in the accompanying drawings in which like reference characters refer to the same elements or functions throughout the views, and in which.

DETAILED DESCRIPTION

Figure 1:
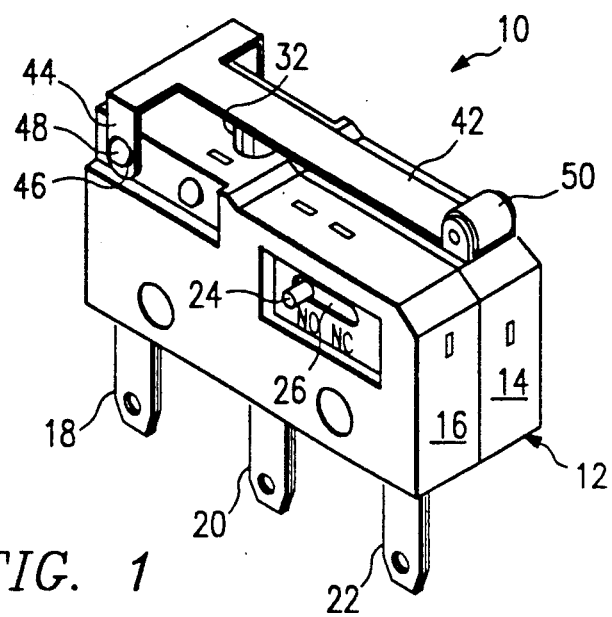
FIG. 1 is a perspective view of an optical micro-switch of the invention.

FIG. 1 illustrates an assembled optical micro-switch 10 in accordance with the present invention. FIG. 1 illustrates in general a housing 12 which includes a first housing half 14 and a second housing half 16. Three prongs extend from housing 12 to provide electrical connection with the optical micro-switch 10. These prongs are an input prong 18, an output prong 20 and a ground prong 22. A knob 24 is connected to a slide 26 and is positioned on the side of second housing half 16. A portion of a plunger 32 extends through the top of housing 12. Also illustrated is a lever 42 which has downwardly extending side arms 44 which include holes 46. Housing 12 has extending male members 48 which engage with holes 46 to connect lever 42 to housing 12. Lever 42 has a roller 50 opposite the downward extending side arms 44.

Figure 2:
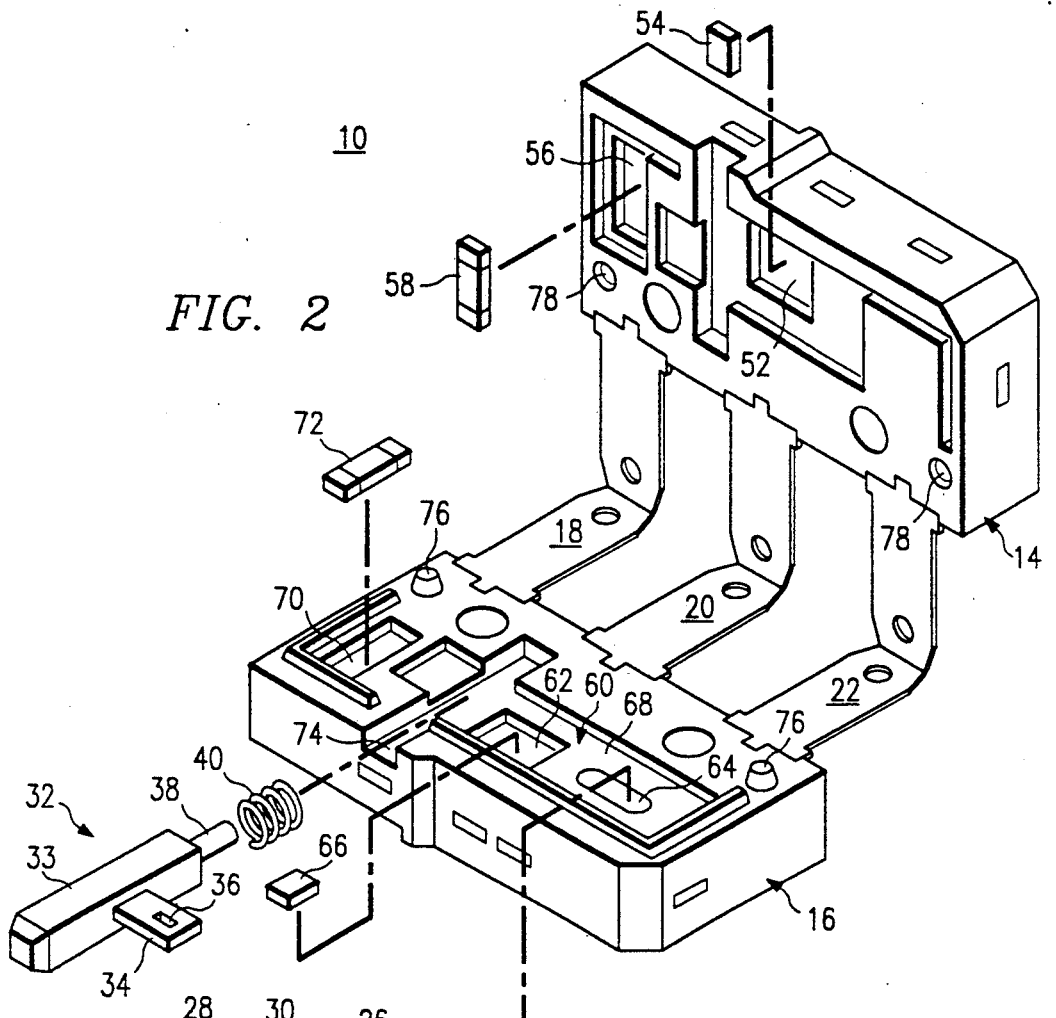
FIG. 2 is an exploded view of the optical micro-switch of FIG. 1.

FIG. 2 shows the housing halves 14 and 16 separated to illustrate the various components of the optical micro-switch 10. Each housing half 14 and 16 defines several cavities for receiving various components of optical micro-switch 10. For example, first housing half 14 defines a cavity 52 which receives an LED (light-emitting diode) integrated circuit chip 54. A cavity 56 receives resistor 58. The second housing half 16 defines a cavity 60 including deeper regions 62 and 64. Region 62 receives a light sensor integrated circuit chip 66. Region 64 extends through second housing half 16 and opens on the exterior of the housing half 16. Knob 24 on slide 26 is inserted into region 64. The planar body portion 27 of slide 26 is positioned to be flush with shallow region 68 of cavity 60. When slide 26 is positioned in this manner, knob 24 extends through region 64 to the exterior of housing half 16 (see FIG. 1). The planar body portion 27 of slide 26 covers the light sensor integrated circuit chip 66 positioned in region 62. First aperture 28 and second aperture 30 are formed in planar body 27 of slide 26. A cavity 70 receives resistor 72.

Also shown in FIG. 2, a plunger 32 comprising a main portion 33, a side arm 34 extending at generally a right angle from the main portion 33 and having an aperture 36 formed therein and a plunger shaft 38. Plunger shaft 38 of plunger 32 is inserted into a spring 40. Housing halves 14 and 16 have matching openings therein to form a cavity 74. Cavity 74 receives the plunger 32 and spring 40. Spring 40 acts to urge plunger 32 upwardly so that a portion thereof extends through the top of housing 12 as shown in FIG. 1. Cavity 52, which receives LED integrated circuit chip 54, also receives side arm 34 which covers LED integrated circuit chip 54. After all the components of optical micro-switch 10 are inserted into their respective cavities, prongs 18, 20 and 22 are folded to engage housing halves 14 and 16. First housing half 14 and second housing half 16 are then snapped together by engaging male members 76 of second housing half 16 with female counterparts 78 in first housing half 14.

In general, optical micro-switch 10 is designed to generate light in first housing half 14 and to permit such light to travel to second housing half 16 when an optical path is provided when plunger aperture 36 is aligned with first aperture 28 or second aperture 30 in slide 26. When such an optical path is provided, light travels to the light sensor integrated circuit chip 66 in second housing half 16 and an output voltage is provided on output prong 20. Housing halves 14 and 16 are generally formed of a plastic which is opaque, thereby preventing light generated within the interior of housing 12 from escaping to the exterior thereof and preventing light exterior to housing 12 from being passed to the interior thereof.

Figure 3:
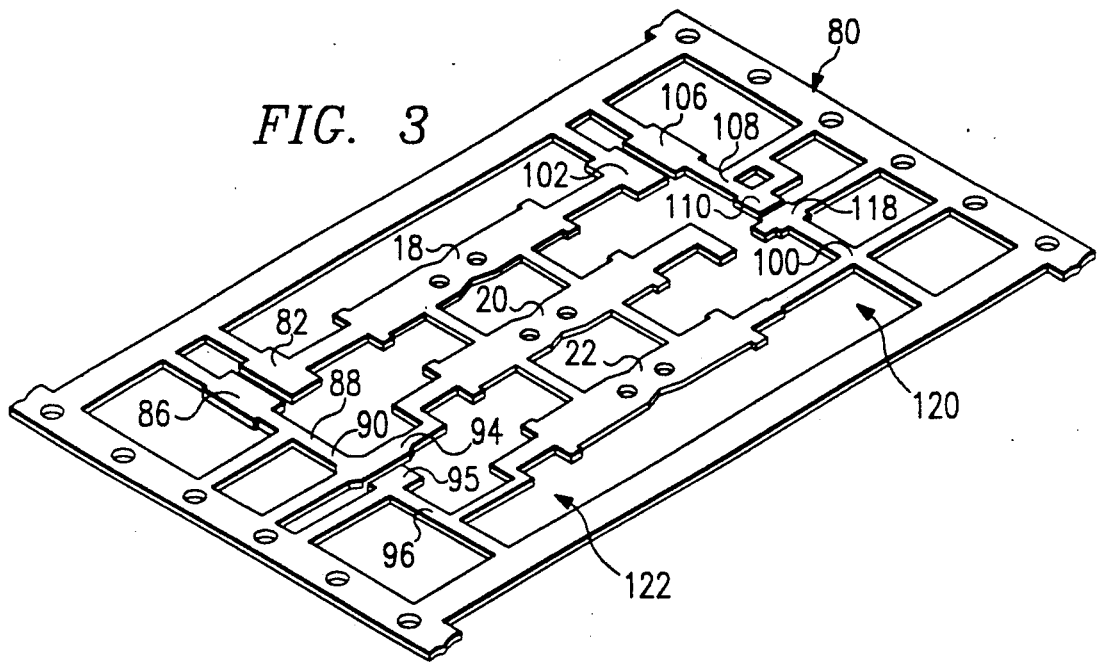
FIG. 3 is a perspective view illustrating one stage in the manufacturing process of the optical micro-switch of the invention.

The first step in the manufacture of the optical micro-switch 10 is to provide a continuous tape lead frame 80 which comprises a blank strip of conductive sheet material. In the second step, terminal members 82, 86, 90, 94, 95, 102, 106, 110 and 118, conductive leads 88, 96, 100 and 108 and prongs 18, 20 and 22 are then stamped in the continuous tape lead frame 80 as illustrated in FIG. 3. FIG. 3 only shows a portion of continuous tape lead frame 80, illustrating only the first housing half lead framework 120 and the second housing half lead framework 122 for a single optical micro-switch, however, it is to be understood that continuous tape lead frame 80 extends in either direction such that continuous tape lead frame 80 contains a plurality of duplicative first housing half and second housing half lead frameworks 120 and 122.

Figure 4:
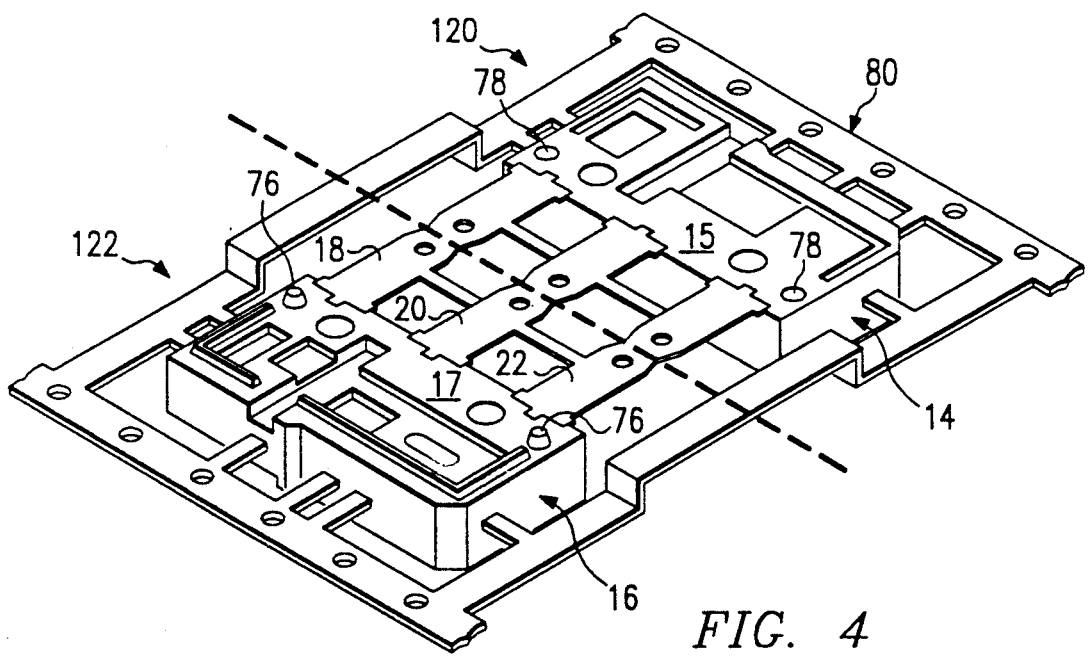
FIGS. 4 is a perspective view illustrating a subsequent stage in the manufacturing process of the optical micro-switch of the invention.

With reference to FIG. 4, the next manufacturing step involves molding plastic modules, which serve as housing halves 14 and 16, to lead frameworks 120 and 122 of continuous tape lead frame 80. The plastic module of first housing half 14 is molded around first housing half lead framework 120 while the plastic module serving as second housing half 16 is molded to second housing half lead framework 122. During the molding step, those portions of continuous tape lead frame 80 defining prongs 18, 20 and 22 are positioned upwardly such that the upper surface of each prong is positioned in the same plane as the upper surface 15 of first housing half 14 and upper surface 17 of second housing half 16. Once the housing halves 14 and 16 are molded to continuous tape lead frame 80, the next manufacturing step is the assembling of the various components of optical micro-switch 10 into their respective cavities as discussed with regard to FIG. 2.

Figure 5:
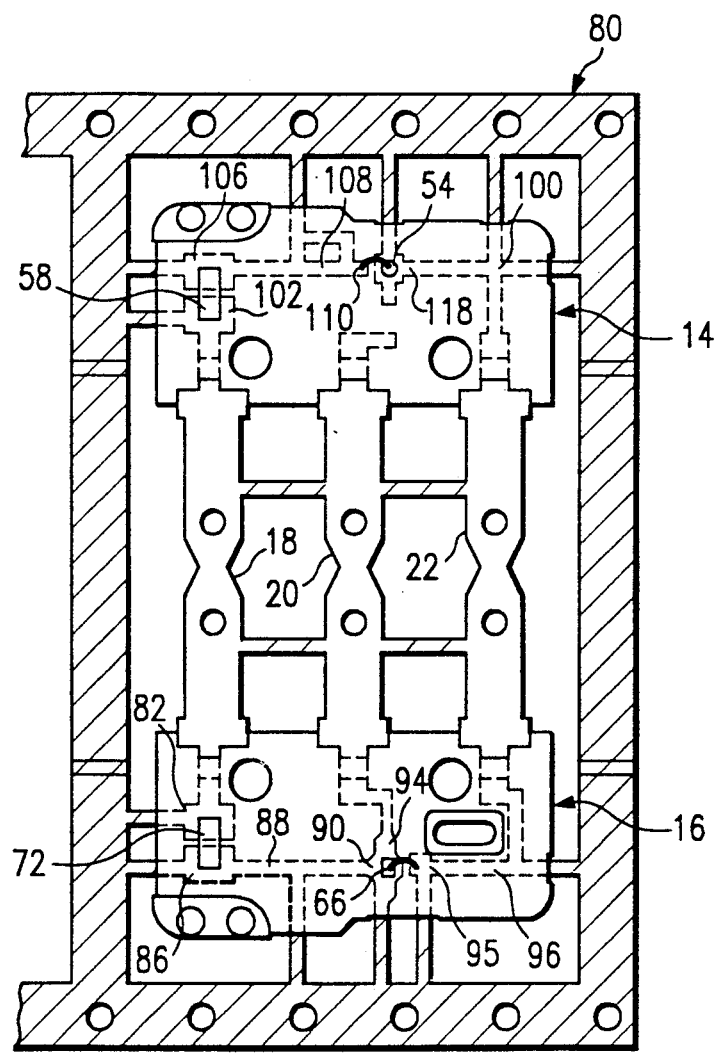
FIG. 5 is a plan view illustrating a subsequent stage in the manufacturing process of the optical micro-switch of the invention.

FIG. 5 shows a top plan view of first housing half 14 and second housing half 16 attached to a continuous tape lead frame 80. The various terminal members and conductive leads embedded within first housing half 14 and second housing half 16, which form the interconnections for the electronic circuitry of optical micro-switch 10, are shown in phantom outline. Portions of continuous tape lead frame 80, which are to be cut or sheared off during the later steps of the manufacturing process are illustrated as shaded areas.

As disclosed in FIG. 5, the various electrical components are mounted in the appropriate housing half. In first housing half 14, resistor 58 is mounted from terminal member 102 to terminal member 106 by conventional means such as solder. LED integrated circuit chip 54 is mounted from terminal member 110 to terminal member 118 with conventional means such as conductive epoxy or solder. In second housing half 16, resistor 72 is mounted from terminal member 82 to terminal member 86 by conventional means such as solder. Appropriate terminals of sensor integrated circuit chip 66 are connected to terminal members 90, 94 and 95 by conventional means. It will be appreciated that prongs 18 and 22 provide electrical connection between first housing half 14 and second housing half 16. Plunger 32, with spring 40 in operative position with respect to plunger shaft 38, is positioned in cavity 74 in second housing half 16. Slide 26 is positioned in cavity 60 such that knob 24 protrudes through region or opening 64.

After all the optical micro-switch 10 components are assembled in their respective housing half, the portions of continuous tape lead frame 80 which are not part of the assembly or operation of the optical micro-switch 10 are cut or sheared off. The portions of continuous tape lead frame 80 which are sheared off or cut off are shown as shaded areas in FIG. 5. Once the extraneous portions of continuous lead tape 80 are cut or sheared off, the prongs 18, 20 and 22 which connect first housing half 14 and second housing half 16 are folded along the dashed line illustrated in FIG. 4 to engage the two housing halves, with male members 76 of second housing half 16 being inserted into female counterparts 78. Since the prongs 18, 20 and 22 portion of continuous tape lead framework 80 are at a higher plane than the remaining portions of the framework, when the prongs 18, 20 and 22 are folded together they meet at the center of the bottom side of optical micro-switch 10 as illustrated in FIG. 1. The prongs 18, 20 and 22 which extend from each housing half 14 and 16 are 0.010 inch thick, and when the prongs 18, 20 and 22 are folded together, prongs 18, 20 and 22 which extend from the bottom of optical micro-switch 10 are 0.020 inch thick. Once housing halves 14 and 16 are engaged together and sealed by conventional means, the optical micro-switch 10 components are enclosed therein, and the assembly of the optical micro-switch is complete. It should be understood that the process for assembling each optical micro-switch 10 is the same for each duplicative pair of first housing half and second housing half lead frameworks 120 and 122 along continuous tape lead frame 80.

Figure 6:
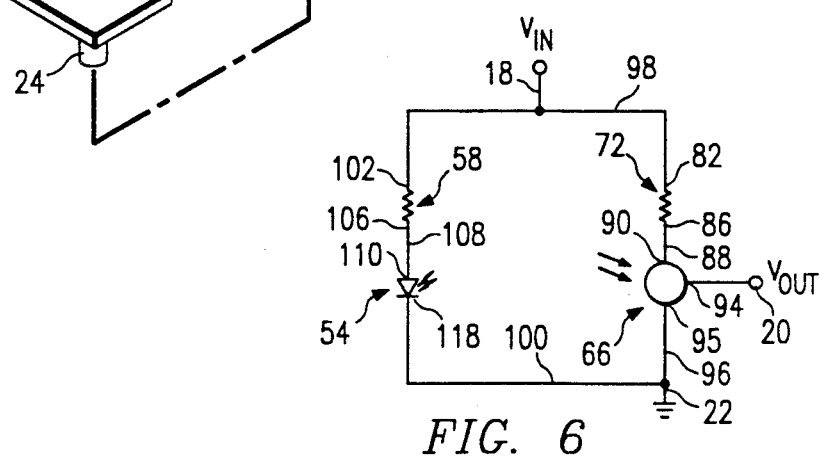
FIG. 6 is a schematic diagram illustrating the electronic circuitry of the optical micro-switch of the invention.

The operation of the optical micro-switch 10 will be discussed with reference to FIGS. 1, 2 and 6. In operation of the optical micro-switch 10, a source of voltage is applied across prongs 18 and 22. If the source of voltage is above a predetermined value, LED integrated circuit chip 54 will be activated and will emit light. If the light sensor integrated circuit chip 66 senses light, a voltage output will be applied across prongs 20 and 22 which is approximately equal to the voltage applied across prongs 18 and 22. If the light sensor integrated circuit chip 66 does not sense light from the LED integrated circuit chip 54, zero voltage will appear across prongs 20 and 22 because prongs 20 and 22 are shorted together through the light sensor integrated circuit chip 66. Whether light sensor integrated circuit chip 66 detects light depends upon whether plunger aperture 36 aligns with either the first aperture 28 or second aperture 30 of slide 26 to provide a light passageway (see FIG. 2). Slide 26 has two positions: normally closed, second position, (labeled NC in FIG. 1) and normally open, first position, (labeled NO in FIG. 1). To change from the normally closed position to the normally open position, and vice versa, simply involves using knob 24 for moving slide 26 from one position to the other position. As discussed with regard to FIG. 2, when plunger 32 and spring 40 are assembled in housing 12, a portion of plunger 32 extends through the top of housing 12 (see also FIG. 1). When lever 42, which is attached to housing 12 by side arms 44, as described with regard to FIG. 1, is pushed in the downwardly direction, lever 42 will make contact with the portion of plunger 32 that extends through housing 12 and urge plunger 32 back into the interior of housing 12 (the actuated position of the lever). Any type of activation means can be used to engage roller 50 for pushing lever 42 downwardly. Release of pressure on lever 42 causes spring 40 to urge plunger 32 upwardly so that it again extends through the top of the housing 12 (the non-actuated position of lever 42).

In the embodiment illustrated in FIGS. 1 and 2, when slide 26 is in the normally closed position (second position) and lever 42 is in the non-actuated position, plunger 32 is in the first or up position and plunger aperture 36 aligns with first aperture 28 in slide 26 creating a light passageway from LED integrated circuit chip 54 in first housing half 14 to light sensor integrated circuit chip 66 in second housing half 16. Thus, in this configuration, when sufficient voltage is applied to the input prong 18, LED integrated circuit chip 54 will be turned-on and will generate light which can be detected by light sensor integrated circuit chip 66 resulting in an output voltage on output prong 20. When, however, lever 42 is in the actuated position so that plunger 32 is in the second or down position and plunger aperture 36 is moved to a down position and out of alignment with first aperture 28, there is not any light passageway between first housing half 14 and second housing half 16. Therefore, any light generated by LED integrated circuit chip 54 will be blocked by planar body portion of side arm 34 and output prong 20 will be tied to ground. On the other hand, when slide 26 is in the normally open position and lever 42 is in the non-actuated position, there is not any light passageway between first housing half 14 and second housing half 16. However, when lever 42 is in the actuated position, plunger aperture 36 aligns with second aperture 30 thereby providing a light passageway between first housing half 14 and second housing half 16. Therefore, when sufficient voltage is applied to input prong 18, LED integrated circuit chip 54 will generate light which will be transmitted to light sensor integrated circuit chip 66 creating an output voltage on output prong 20.

While the foregoing illustrates and discloses the preferred embodiment of the invention with respect to the composition and components of the optical micro-switch, and the method of mass-producing such optical micro-switches, it is to be understood that many changes can be made in the composition and components of the optical micro-switch, the method of mass-producing such optical micro-switches, and the application of the optical micro-switch as a matter of engineering choices without departing from the spirit and scope of the invention as defined by the appended claims.

I claim:

1. An optical switch comprising:
    a housing:
    an input lead, an output lead and a common lead extending from said housing;
    a light-emitting device position within said housing and operatively connected at least between said input lead and said common lead;
    a light-sensing device positioned within said housing and operatively connected at least between said output lead and said common lead, said light-sensing device and said light-emitting device disposed at respective ends of a light transmission path;
    an operator-movable means positioned in said light transmission path, movable between a first position which configures the optical switch for normally switch-open position and operation and a second position which configures the optical switch operation and a second position which configures the optical switch for normally switch-closed position and operation and including light-blocking means and light-passing means; and a switch-actuating means positioned in said light transmission path, movable between a first position and a second position and including light-blocking means and light-passing means;

whereby said optical switch is in the switch-open position without an output voltage available on said output lead and with the light transmission path blocked when said operator-movable means and said switch-actuating means are both positioned in said first position, said optical switch is in the switch-open position with the light transmission path blocked when said operator-movable means and said switch-actuating means are both position in said second position, said optical switch is in the switch-closed position with an output voltage available on said output lead and with the light transmission path not blocked when said operator-movable means is positioned in said first position and said switch-actuating means is positioned in said second position, said optical switch is in the switch-closed position with the light transmission path not blocked when said operator-movable means is positioned in said second position and said switch-actuating means is positioned in said first position.

2. The optical switch of claim 4 further including resilient means for urging said switch-actuating means toward said first position.

3. The optical switch of claim 4 further including actuating lever means operatively attached to said housing and positionable to move said switch-actuating means from said first position to said second position.

4. The optical switch of claim 1 wherein said light-passing means of said operator-movable means comprises two apertures formed in said light-blocking means.

5. The optical switch of claim 1 wherein said light-passing means of said switch-actuating means comprises an aperture formed in said light-blocking means.

6. The optical switch of claim 1 wherein said operator-movable means comprises a planar body portion including at least two apertures formed therein.

7. The optical switch of claim 1 wherein said switch-actuating means comprises a plunger body having a planar body portion extending at generally right angles therefrom and having an aperture formed in said planar body portion.

8. The optical switch of claim 1 wherein said operator-movable means is positioned between said switch-actuating means and said light-sensing device.

9. The optical switch of claim 1 wherein said housing is formed of an opaque material.

10. An optical switch comprising:

a housing including a first housing-half defining a first plurality of cavities and including a first group of conductive leads formed therein and a second hosing-half defining a second plurality of cavities and including a second group of conductive leads formed therein;

an input lead operatively connected to at least said first group of conductive leads;

an output lead operatively connected to at least said second group of conductive leads;

a common lead operatively connected to at least said second group of conductive leads;

a light-emitting device positioned in a predetermined one of said first plurality of cavities and operatively connected to predetermined ones of said first group of conductive leads;

a light-sensing device positioned in a predetermined one of said second plurality of cavities and operatively connected to predetermined ones of said second group of conductive leads, said light-sensing device and said light-emitting device disposed at respective ends of a light transmission path;

an operator-movable means positioned in said light transmission path, movable between a first position which configures the optical switch for normally switch-open position and operation and a second position which configures the optical switch for normally switch-closed position and operation and including light-blocking means and light-passing means; and a switch-actuating means positioned in said light transmission path, movable between a first position and a second position and including light-blocking means and light-passing means;

whereby said optical switch is n the switch-open position without an output voltage available on said output lead and with the light transmission path blocked when said operator-movable means and said switch-actuating means are both positioned in said first position, said optical switch is in the switch-open position with the light transmission path blocked when said operator-movable means and said switch-actuating means are both positioned in said second position, said optical switch is in the switch-closed position with an output voltage available on said output lead and with the light transmission path not blocked when said operator-movable means is positioned in said first position and said switch-actuating means is positioned in said second position, said optical switch is in the switch-closed position with the light transmission path not blocked when said operator-movable the light transmission path not blocked when said operator-movable means is positioned in said second position and said switch-actuating means is positioned in said first position.

11. The optical switch of claim 10 further including resilient means for urging said switch-actuating means toward said first position.

12. The optical switch of claim 10 further including actuating lever means operatively attached to said housing and positionable to move said switch-actuating means from said first position to said second position.

13. The optical switch of claim 10 wherein said light-passing means of said operator-movable means comprises two apertures formed in said light-blocking means.

14. The optical switch of claim 10 wherein said light-passing means of said switch-actuating means comprises an aperture formed in said light-blocking means.

15. The optical switch of claim 10 wherein said operator-movable means comprises a planar body portion including at least two apertures formed therein.

16. The optical switch of claim 10 wherein said switch-actuating means comprises a plunger body having a planar body portion extending at generally right angles therefrom and having an aperture formed in said planar body portion.

17. The optical switch of claim 10 wherein said operator-movable means is positioned between said switch-actuating means and said light-sensing device.

18. The optical switch of claim 10 wherein said housing is formed of an opaque material.

19. The optical switch of claim 1 wherein said light-emitting device will be activated by a voltage above a predetermined value applied across said input lead and said common lead.

20. The optical switch of claim 10 wherein said light emitting device will be activated by a voltage above a predetermined value applied across said predetermined ones of said first group of conductive leads.

* * * * *